United States Patent
Suzuki et al.

(10) Patent No.: US 7,700,244 B2
(45) Date of Patent: Apr. 20, 2010

(54) MASK BLANK PROVIDING SYSTEM, MASK BLANK PROVIDING METHOD, MASK BLANK TRANSPARENT SUBSTRATE MANUFACTURING METHOD, MASK BLANK MANUFACTURING METHOD, AND MASK MANUFACTURING METHOD

(75) Inventors: Osamu Suzuki, Tokyo (JP); Hiroyuki Akagawa, Tokyo (JP); Masaru Tanabe, Tokyo (JP); Atsushi Kawaguchi, Tokyo (JP); Naozumi Ishibashi, Tokyo (JP)

(73) Assignee: Hoya Corporation, Tokyo (JP)

( * ) Notice: Subject to any disclaimer, the term of this patent is extended or adjusted under 35 U.S.C. 154(b) by 1036 days.

(21) Appl. No.: 11/225,153

(22) Filed: Sep. 14, 2005

(65) Prior Publication Data
US 2006/0159931 A1 Jul. 20, 2006

(30) Foreign Application Priority Data
Sep. 16, 2004 (JP) .............................. 2004-269569

(51) Int. Cl.
G03F 1/00 (2006.01)
(52) U.S. Cl. .............................. 430/5; 430/311; 716/19; 716/21
(58) Field of Classification Search .................... 430/5, 430/311; 716/19, 21
See application file for complete search history.

(56) References Cited

U.S. PATENT DOCUMENTS 6,883,158 B1 * 4/2005 Sandstrom et al. ............ 716/19

2004/0063000 A1 * 4/2004 Maurer et al. ................. 430/5

FOREIGN PATENT DOCUMENTS

| CN | 1351721 A | 5/2002 |
|---|---|---|
| JP | 1-39653 B2 | 8/1989 |
| JP | 8-31723 A | 2/1996 |
| JP | 2002-90978 A | 3/2002 |
| JP | 2002-162727 A | 6/2002 |
| JP | 2003-81654 A | 3/2003 |
| JP | 2003-264225 A | 9/2003 |
| JP | 2003-280168 A | 10/2003 |
| JP | 2004-83377 A | 3/2004 |

OTHER PUBLICATIONS

Chinese Office Action and translation dated Jul. 3, 2009.

* cited by examiner

Primary Examiner—Mark F Huff
Assistant Examiner—Rashid Alam
(74) Attorney, Agent, or Firm—Sughrue Mion, PLLC (57) ABSTRACT

A mask blank manufacturing department manufactures a mask blank by forming a thin film to be a mask pattern on a mask blank transparent substrate. When providing the mask blank to a mask manufacturing department, the mask blank manufacturing department provides optical characteristic information (transmittance variation) of the mask blank transparent substrate and optical characteristic information (transmittance variation and/or phase difference variation) of the mask blank to the mask manufacturing department. The optical characteristic information of the mask blank transparent substrate is provided to the mask blank manufacturing department from a materials processing department that manufactures mask blank transparent substrates.

12 Claims, 6 Drawing Sheets

MASK BLANK PROVIDING SYSTEM, MASK BLANK PROVIDING METHOD, MASK BLANK TRANSPARENT SUBSTRATE MANUFACTURING METHOD, MASK BLANK MANUFACTURING METHOD, AND MASK MANUFACTURING METHOD

This application claims priority to prior Japanese patent application JP2004-269569, the disclosure of which is incorporated herein by reference.

BACKGROUND OF THE INVENTION

This invention relates to a mask blank providing system, a mask blank providing method, a mask blank transparent substrate manufacturing method, and a mask blank manufacturing method that can assure optical characteristics of a mask blank transparent substrate and a mask blank, and further relates to a mask manufacturing method that can prevent a pattern defect of a transfer target.

In recent years, following the miniaturization of semiconductor devices, reduction in wavelength of exposure light sources has proceeded so that the exposure wavelength has reached 200 nm or less. As such exposure light sources, proposal is made of, for example, an ArF excimer laser (wavelength: 193 nm) and a F2 excimer laser (wavelength: 157 nm). Shield films (light shielding films, opaque films) and phase shift films for shielding light and changing phases with respect to those exposure wavelengths have been rapidly developed and various film materials have been proposed (see, e.g. JP-A-2002-162727 and JP-A-2003-280168).

Further, several proposals have been made of manufacturing methods that suppress variation of optical characteristics (e.g. transmittance and phase difference) with which problems are expected in formation of those films (see, e.g. JP-A-2002-90978). Thus the variation of optical characteristics of the films has currently been suppressed.

However, upon measurement of the optical characteristics (transmittance, reflectance, etc.) of manufactured mask blanks, a problem has arisen that those mask blanks not satisfying a specification relating to variation of optical characteristics are included at a certain rate.

Further, when a mask pattern formed on a mask is transferred onto a transfer target to thereby form a transfer pattern by the use of an exposure system, a problem has arisen that the transfer target is subjected to occurrence of a pattern defect while no pattern defect is found in the mask pattern formed on the mask.

The present inventors have attempted to locate a cause for those problems from various aspects and found out that they are caused by transmittance variation in a transparent substrate of a mask blank due to absorption by the transparent substrate itself which has not conventionally been put in question.

Hereinbelow, description will be made in detail about the reason why the mask blank deviating from the specification relating to the variation of optical characteristics is manufactured and the reason for the occurrence of the transfer pattern defect, respectively, which have been learned from researches by the present inventors.

Currently, synthetic quartz glass is used as a material of a substrate of a mask blank which is adapted for use of the ArF excimer laser as an exposure light source and which is under rapid development. This synthetic quarts glass is also used as a material of a substrate of a practically used mask blank adapted for use of a KrF excimer laser as an exposure light source. The exposure wavelength of the KrF excimer laser is 248 nm. Therefore, even if there is manufacturing variation in synthetic quarts glass, the transmittance (transmittance in a plate thickness direction) is 88% or more (wavelength λ: 240 nm) with the 6025 size (plate thickness: 6.35 mm), which thus has been out of question.

However, when the wavelength of the exposure light source decreases to a short wavelength like 193 nm, the transmittance (transmittance in a plate thickness direction) sometimes decreases to 80% with the 6025 size (plate thickness: 6.35 mm) due to absorption by the substrate itself with respect to the exposure light caused by manufacturing variation in synthetic quartz glass and so on.

Further, in the present state, the manufacturing variation in the thin film formation is not completely overcome. It is thus presumed that the mask blank not satisfying the specification relating to the variation of optical characteristics as described above is manufactured due to synergistic action of the variation of substrate material transmittance and the variation of thin film optical characteristics.

On the other hand, with respect to a mask, a region where the transmittance is reduced due to the absorption by the synthetic quartz glass substrate itself does not exert an influence upon a transfer target when such a region is included in a shield film pattern region. However, when such a region is exposed in a region where a mask pattern is not formed, or when such a region bridges portions of the mask pattern, a portion where exposure light should not be shielded is resultantly shielded to thereby cause a change in intensity of the exposure light with respect to the transfer target. This is presumed to be the cause that generates the pattern defect in the transfer target although no pattern defect is found in the mask.

In recent years, mask patterns have been becoming much finer and more elaborate. Therefore, even if a defect that affects pattern transfer onto a transfer target can be identified on a mask, pattern alteration or correction cannot be often performed and. In this case, it is necessary to newly manufacture a mask from the beginning.

SUMMARY OF THE INVENTION

It is therefore an object of this invention to provide a mask blank providing system, a mask blank providing method, a mask blank transparent substrate manufacturing method, a mask blank manufacturing method, and a mask manufacturing method that can prevent deviation of a mask blank from a specification relating to optical characteristics thereof and occurrence of a pattern defect of a transfer target by assuring the optical characteristics of a mask blank transparent substrate and the mask blank.

In order to achieve the above-mentioned object, according to this invention, there is provided a mask blank providing system comprising:

substrate information storage means for storing optical characteristic information of a mask blank transparent substrate with respect to an exposure wavelength in a manner correlated with the mask blank transparent substrate, the mask blank transparent substrate being provided to a mask blank manufacturing department;

mask blank information storage means for storing optical characteristic information of a mask blank with respect to the exposure wavelength in a manner correlated with the mask blank, the mask blank being provided to a mask manufacturing department;

substrate information providing means for providing, to the mask blank manufacturing department and/or said mask manufacturing department, the optical characteristic information of the mask blank transparent substrate with respect to the exposure wavelength stored in the substrate information storage means; and mask blank information providing means for providing, to the mask manufacturing department, the optical characteristic information of the mask blank with respect to the exposure wavelength stored in the mask blank information storage means.

With this structure, the optical characteristics of the transparent substrate and the mask blank with respect to the exposure wavelength are assured. It is therefore possible to solve the problem of the manufacture of the mask blank deviating from the specification of the optical characteristics and the problem of the occurrence of the pattern defect in the transfer target.

According to this invention, there is provided a mask blank providing system, further comprising a server of a materials processing department that manufactures the mask blank transparent substrate, a server of the mask blank manufacturing department that manufactures the mask blank by forming a thin film to be a mask pattern on the mask blank transparent substrate, a server of the mask manufacturing department that manufactures a mask by patterning the thin film of the mask blank, and a communication line connecting the servers to allow communications therebetween, wherein the server of the materials processing department comprises the substrate information storage means, the server of the mask blank manufacturing department comprises the substrate information storage means and the mask blank information storage means, and the server of the mask manufacturing department comprises the substrate information storage means and the mask blank information storage means.

With this structure, the optical characteristic information of the transparent substrate and the mask blank can be quickly and inexpensively exchanged between the servers of the respective manufacturing departments.

According to this invention, there is provided a mask blank providing system, further comprising a transmit/receive section of a materials processing department that manufactures the mask blank transparent substrate, a transmit/receive section of the mask blank manufacturing department that manufactures the mask blank by forming a thin film to be a mask pattern on said mask blank transparent substrate, a transmit/receive section of the mask manufacturing department that manufactures a mask by patterning the thin film of said mask blank, and servers capable of communicating with the transmit/receive sections through a communication line, wherein the servers include the substrate information storage means and the mask blank information storage means.

With this structure, it is possible to commonly share the servers (various information storage means). When the foregoing information is managed in the same company, it is particularly effective because unification of the information can be achieved.

According to this invention, there is provided a mask blank providing system, further comprising thin film selection means for selecting a thin film to be formed on the mask blank transparent substrate on the basis of the optical characteristic information of the mask blank transparent substrate with respect to the exposure wavelength.

With this structure, deviation from the specification due to incongruence between the transparent substrate and the thin film can be prevented by effectively using the optical characteristic information of the transparent substrate.

According to this invention, there is provided a mask blank providing system, wherein the optical characteristic information of the mask blank transparent substrate with respect to the exposure wavelength includes transmittance variation in the substrate plane with respect to the exposure wavelength.

With this structure, it is possible to assure the transmittance variation in the substrate plane of the transparent substrate with respect to the exposure wavelength to thereby prevent deviation from the specification caused thereby.

According to this invention, there is provided a mask blank providing system, wherein the optical characteristic information of the mask blank with respect to the exposure wavelength includes transmittance variation and/or phase difference variation in the thin film plane with respect to the exposure wavelength.

With this structure, it is possible to assure the transmittance variation and phase difference variation in the thin film plane of the mask blank with respect to the exposure wavelength to thereby prevent deviation from the specification caused thereby.

According to this invention, there is provided a mask blank providing method wherein a mask blank manufacturing department manufactures a mask blank by forming a thin film to be a mask pattern on a mask blank transparent substrate and, when providing the mask blank to a mask manufacturing department, the mask blank manufacturing department provides, to the mask manufacturing department, optical characteristic information of the mask blank transparent substrate with respect to an exposure wavelength and optical characteristic information of the mask blank with respect to the exposure wavelength.

In this method, it is possible to assure the optical characteristics of the transparent substrate and the mask blank to thereby prevent deviation of the mask blank from the specification and occurrence of the pattern defect of the transfer target.

According to this invention, there is provided a mask blank providing method, wherein the optical characteristic information of the mask blank transparent substrate with respect to the exposure wavelength is provided to the mask blank manufacturing department from a materials processing department that manufactures the mask blank transparent substrate.

In this method, the mask blank manufacturing department can provide the optical characteristic information of the transparent substrate to the mask manufacturing department without measuring the optical characteristics of the transparent substrate.

According to this invention, there is provided a mask blank providing method, wherein the optical characteristic information of the mask blank transparent substrate with respect to the exposure wavelength includes transmittance variation in the substrate plane with respect to the exposure wavelength.

In this method, it is possible to assure the transmittance variation in the substrate plane of the transparent substrate with respect to the exposure wavelength to thereby prevent deviation from the specification caused thereby.

According to this invention, there is provided a mask blank providing method, wherein the optical characteristic information of the mask blank with respect to the exposure wavelength includes transmittance variation and/or phase difference variation in the thin film plane with respect to the exposure wavelength.

In this method, it is possible to assure the transmittance variation and phase difference variation in the thin film plane of the mask blank with respect to the exposure wavelength to thereby prevent deviation from the specification caused thereby.

According to this invention, there is provided a mask blank transparent substrate manufacturing method, comprising:

mirror-polishing a surface of a mask blank transparent substrate so as to enable measurement of an optical characteristic thereof with respect to an exposure wavelength;

irradiating light having a wavelength equal to the exposure wavelength onto the mirror-polished substrate surface to thereby obtain optical characteristic information of the mask blank transparent substrate; and storing a correlation between the mask blank transparent substrate and the optical characteristic information thereof.

In this manufacturing method, it is possible to assure the optical characteristics of the transparent substrate to thereby prevent deviation of the mask blank from the specification caused by a material of the transparent substrate and occurrence of the pattern defect of the transfer target.

According to this invention, there is provided a mask blank transparent substrate manufacturing method, wherein the optical characteristic information of the mask blank transparent substrate includes transmittance variation in the substrate plane with respect to the exposure wavelength.

In this manufacturing method, it is possible to assure the transmittance variation in the substrate plane of the transparent substrate with respect to the exposure wavelength to thereby prevent deviation from the specification caused thereby.

According to this invention, there is provided a mask blank transparent substrate manufacturing method, wherein the exposure wavelength is 140 nm to 200 nm.

In this manufacturing method, it is possible to assure the transmittance variation in the substrate plane even in the short wavelength region of 140 nm to 200 nm where a change in transmittance due to a material of the transparent substrate is large, to thereby prevent deviation from the specification caused thereby.

According to this invention, there is provided a mask blank transparent substrate manufacturing method, wherein a material of the mask blank transparent substrate is a synthetic quartz glass.

In this manufacturing method, it is possible to assure the transmittance variation in the substrate plane even in the case of the synthetic quartz glass where variation of optical characteristics is generated due to manufacturing variation, to thereby prevent deviation from the specification caused thereby.

In this invention, there is provided a mask blank manufacturing method comprising:

forming a thin film to be a mask pattern on the mask blank transparent substrate obtained by the mask blank transparent substrate manufacturing method according to claim 11 to thereby obtain a mask blank;

irradiating light having a wavelength equal to the exposure wavelength onto a surface of the thin film to thereby obtain optical characteristic information of the mask blank; and storing a correlation between the mask blank and the optical characteristic information of the mask blank.

According to this manufacturing method, it is possible to assure the optical characteristics of the mask blank by assuring the transmittance variation and/or phase difference variation in the thin film forming the mask blank, in addition to assuring the optical characteristics of the transparent substrate, to thereby prevent deviation of the mask blank from the specification and occurrence of the pattern defect of the transfer target.

According to this invention, there is provided a mask blank manufacturing method according to claim 15, wherein the optical characteristic information of the mask blank includes transmittance variation and/or phase difference variation in the thin film plane with respect to the exposure wavelength.

In this manufacturing method, it is possible to assure the transmittance variation and phase difference variation in the thin film plane of the mask blank with respect to the exposure wavelength to thereby prevent deviation from the specification caused thereby.

According to this invention, there is provided a mask blank manufacturing method, further comprising:

selecting the thin film to be formed on the mask blank transparent substrate on the basis of the optical characteristic information of the mask blank transparent substrate.

In this manufacturing method, it is possible to prevent deviation from the specification of the optical characteristics caused by incongruence between the transparent substrate and the thin film.

According to this invention, there is provided a mask blank manufacturing method, wherein the exposure wavelength is 140 nm to 200 nm.

In this manufacturing method, it is possible to assure the transmittance variation in the substrate plane and the transmittance variation and/or phase difference variation in the thin film plane in the mask blank even in the short wavelength region of 140 nm to 200 nm where a change in transmittance is large due to a material of the transparent substrate and due to the thin film, to thereby prevent deviation of the mask blank from the specification caused thereby.

According to this invention, there is provided a mask manufacturing method of patterning the thin film of the mask blank manufactured by the mask blank manufacturing method to thereby form a mask pattern on the mask pattern transparent substrate.

In this manufacturing method, it is possible to manufacture a mask in which the optical characteristics of the transparent substrate are assured. This makes it possible to solve the problem that the pattern defect is generated in the transfer target although no defect is found in the mask pattern.

According to this invention, there is provided a mask manufacturing method, further comprising:

correcting data of the mask pattern to be formed on said mask blank transparent substrate or determining a position for formation of the mask pattern on the basis of the optical characteristic information of the mask blank transparent substrate and/or the mask blank with respect to the exposure wavelength.

In this manufacturing method, it is possible to reliably prevent the pattern defect of the mask and the pattern defect of the transfer target caused by the optical characteristics of the transparent substrate and the mask blank.

As described above, according to this invention, it is possible to provide optical characteristic information of a mask blank transparent substrate and a mask blank with respect to an exposure wavelength to thereby assure the optical characteristics thereof. This makes it possible to solve the problem of the manufacture of a mask blank deviating from a specification of the optical characteristics and the problem of the occurrence of a pattern defect in a transfer target although no defect is found in a mask pattern.

DESCRIPTION OF THE PREFERRED EMBODIMENTS

Now, description will be made about an embodiment of this invention with reference to the drawings.

In the following description, a materials processing department, a mask blank manufacturing department, a mask manufacturing department, and a device manufacturing department may be provided in the same company or different companies. When provided in the different companies, they may be read as a materials processing maker, a mask blank maker, a mask maker, and a device maker, respectively.

[Mask Blank Providing System]

At first, a mask blank providing system according to the embodiment of this invention will be described with reference to FIGS. 1 and 2.

Figure 1:
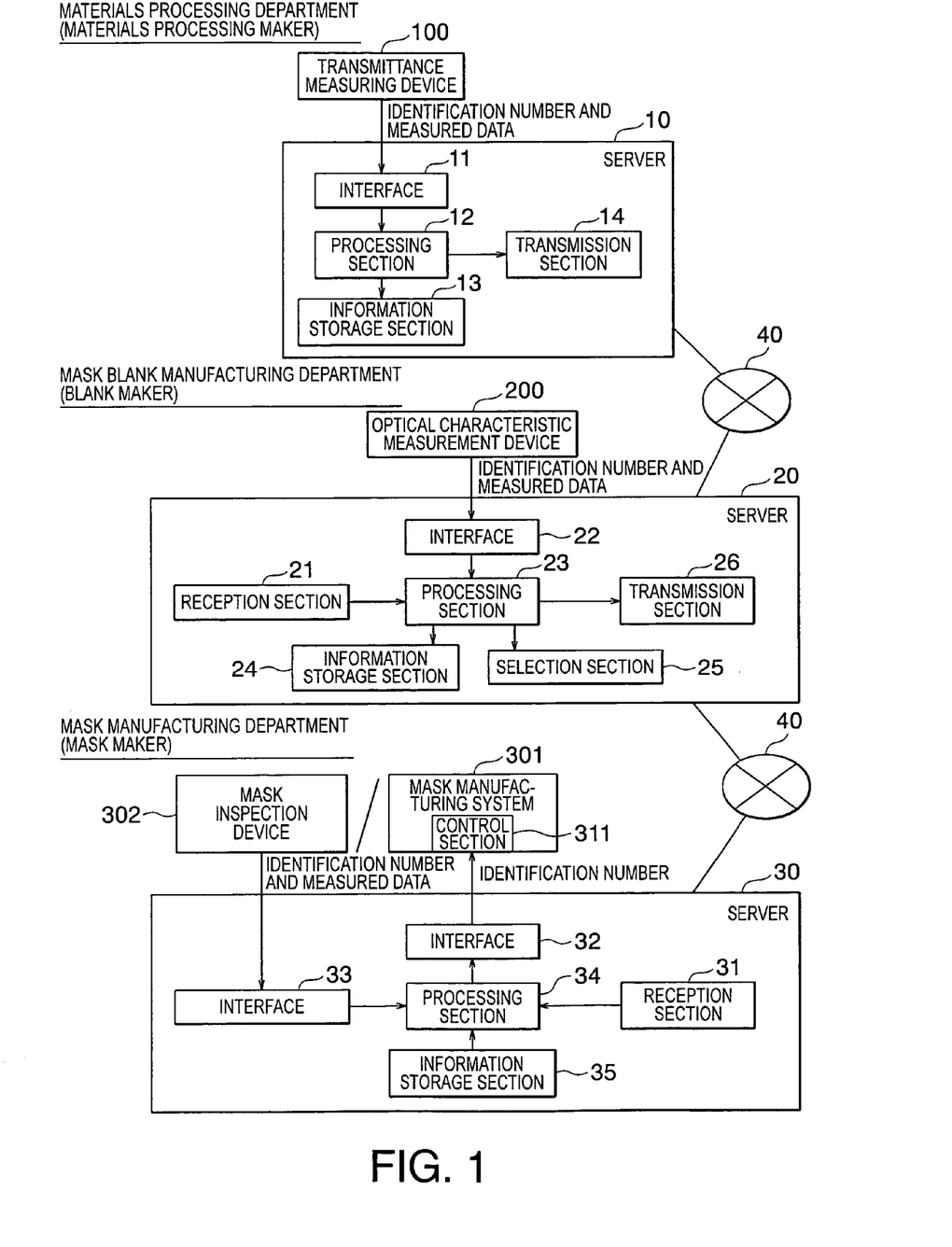
FIG. 1 is a block diagram showing a structure of a mask blank providing system.
Figure 2:
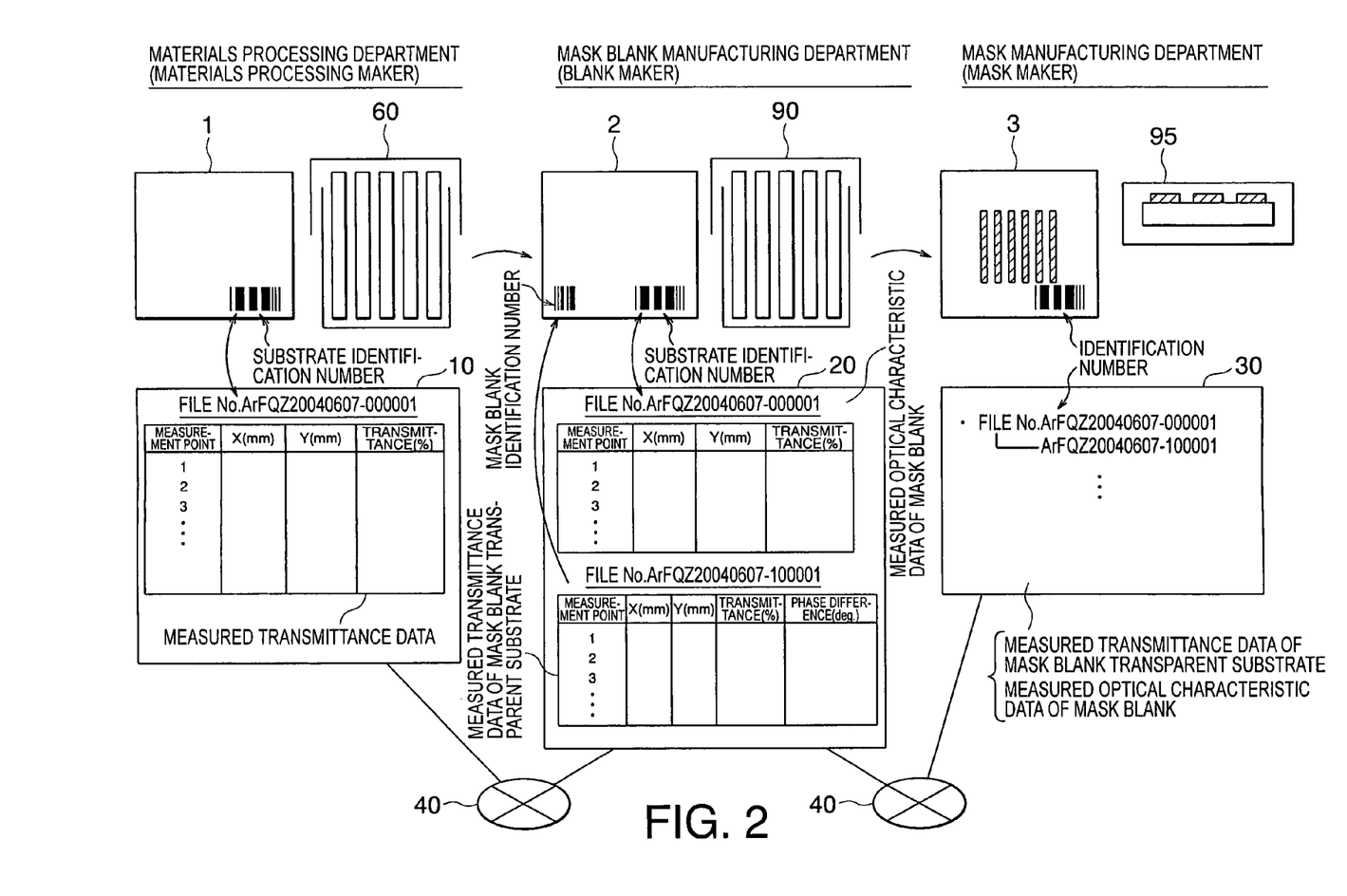
FIG. 2 is an explanatory diagram showing exchanges of information and things between respective manufacturing departments.

As shown in FIG. 1, the mask blank providing system comprises a server 10 of the materials processing department (maker) that manufactures a mask blank transparent substrate 1, a server 20 of the mask blank manufacturing department (blank maker) that manufactures a mask blank 2, a server 30 of the mask manufacturing department (mask maker) that manufactures a mask 3, and communication lines 40 (substrate information providing means and mask blank information providing means) connecting them to allow communications therebetween.

As the communication lines 40, use may be made of a network such as the Internet, a WAN, or a LAN, or a leased line.

When the materials processing department, the mask blank manufacturing department, and the mask manufacturing department correspond to respective departments in the same company, the servers 10, 20, and 30 may be centralized so as to be commonly used.

The server 10 of the materials processing department comprises an interface 11, a processing section 12, an information storage section 13 (substrate information storage means), and a transmission section 14.

The interface 11 performs data conversion of measured transmittance data and an identification number of a substrate whose transmittance was measured, which are input from a transmittance measurement device 100, and sends them to the processing section 12.

The transmittance measurement device 100 measures the transmittance of the mask blank transparent substrate 1 at a plurality of portions on the principal surface thereof and sends these measured transmittance data to the interface 11. Further, in this embodiment, the transmittance measurement device 100 has a function of reading the identification number directly assigned to the mask blank transparent substrate 1 and sending it to the interface 11.

The measured transmittance data and the identification number of the mask blank transparent substrate 1 may be manually input from an input device connected to the interface 11.

The processing section 12 stores the measured transmittance data (optical characteristic information), received from the interface 11, into the information storage section 13 in a manner correlated with the identification number of the substrate. The measured transmittance data stored in the information storage section 13 includes measurement point numbers, measurement point x-coordinates (mm), measurement point y-coordinates (mm), transmittances (%), and so on. On the basis of these data, it is possible to specify transmittance variation in the substrate plane of the mask blank transparent substrate 1.

The transmission section 14 sends the measured transmittance data and the identification number of the substrate stored in the information storage section 13 to the server 20 of the mask blank manufacturing department through the communication line 40. The measured transmittance data to be transmitted and its destination are specified based on the identification number of the substrate and a server address included in delivery information of the mask blank transparent substrate 1.

The server 20 of the mask blank manufacturing department comprises a reception section 21, an interface 22, a processing section 23, an information storage section 24 (substrate information storage means and mask blank information storage means), a selection section 25 (thin film selection means), and a transmission section 26.

The reception section 21 receives the measured transmittance data and the identification number of the mask blank transparent substrate 1 from the server 10 of the materials processing department and sends them to the processing section 23.

The interface 22 performs data conversion of measured data and an identification number of a substrate inputted from an optical characteristic measurement device 200 and sends them to the processing section 23.

The optical characteristic measurement device 200 measures the transmittance and/or the phase difference at a plurality of portions on the surface of a thin film formed in the mask blank 2 and sends measured transmittance data and/or measured phase difference data to the interface 22. Further, in this embodiment, the optical characteristic measurement device 200 has a function of reading the identification number directly assigned to the mask blank transparent substrate 1 (mask blank 2) and sending it to the interface 22.

The measured data and the identification number of the mask blank 2 may be manually input from an input device connected to the interface 22.

The processing section 23 stores the measured transmittance data and the identification number of the mask blank transparent substrate 1, received from the reception section 21, into the information storage section 24 and further stores the measured transmittance data and/or the measured phase difference data of the mask blank 2 and the identification number of the mask blank 2, received from the interface 22, into the information storage section 24. In this event, the identification number of the substrate and the identification number of the mask blank are compared with each other and the measured transmittance data of the mask blank transparent substrate 1 and the measured transmittance data and/or the measured phase difference data of the mask blank 2 are correlated with each other.

The measured data of the mask blank 2 stored in the information storage section 24 includes measurement point numbers, measurement point x-coordinates (mm), measurement point y-coordinates (mm), transmittances (%), phase differences (degree) and so on and. On the basis of these data, it is possible to specify transmittance variation and/or phase difference variation in the plane of the mask blank 2.

Thus, the stored data in the information storage section 24 assures the optical characteristics of the mask blank transparent substrate 1 and the mask blank 2 and can be used in various ways. For example, in this embodiment, upon forming a thin film, which will become a mask pattern, on the mask blank transparent substrate 1, the selection section 25 can select a kind of thin film to be formed on the mask blank transparent substrate 1 on the basis of the measured transmittance data of the mask blank transparent substrate 1 received from the server 10 of the materials processing department.

The transmission section 26 sends the measured transmittance data and the identification number (when necessary) of the mask blank transparent substrate 1 and the measured transmittance data and/or the measured phase difference data and the identification number of the mask blank 2, which are stored in the information storage section 24, to the server 30 of the mask manufacturing department through the communication line 40. The measured data to be transmitted and its destination are specified based on the identification number and a server address included in delivery information of the mask blank 2.

The server 30 of the mask manufacturing department comprises a reception section 31, a first interface 32, a second interface 33, a processing section 34, and an information storage section 35 (substrate information storage means, mask blank information storage means, and mask pattern information storage means).

The reception section 31 receives the measured transmittance data and the identification number of the mask blank transparent substrate 1 and the measured transmittance data and/or the measured phase difference data and the identification number of the mask blank 2 from the server 20 of the mask blank manufacturing department and sends them to the processing section 34.

The first interface 32 is connected to a mask manufacturing system 301, performs data conversion of information stored in the information storage section 35, and sends it to a control section 311 of the mask manufacturing system 301.

The second interface 33 is connected to a mask inspection device 302, performs conversion of measured data and an identification number of the mask 3 inputted from the mask inspection device 302, and sends them to the processing section 34.

The processing section 34 stores the measured transmittance data and the identification number (when necessary) of the mask blank transparent substrate 1 and the measured transmittance data and/or the measured phase difference data and the identification number of the mask blank 2, which are received from the reception section 31, into the information storage section 35. These stored data assure the optical characteristics of the mask blank transparent substrate 1 and the mask blank 2 and can be used in various ways. For example, these data are sent to the control section 311 of the mask manufacturing system 301 so as to be used for determining a position for mask pattern formation, correcting mask pattern data, or the like.

The mask manufacturing system 301 is input the information from the information storage means 35 to the control section 311 and carries out formation of a mask pattern based on this information. The mask inspection device 302 inspects the formed mask pattern and feeds back its result to the processing section 34. The processing section 34 stores the inspection result into the information storage section 35 and, when using it as correction data for mask pattern formation, sends it to the control section 311 of the mask manufacturing system 301.

Referring now to FIGS. 3 to 6, description will be made about a mask blank transparent substrate manufacturing method and providing method and a mask blank manufacturing method and providing method according to the mask blank providing system of this invention.

[Mask Blank Transparent Substrate Manufacturing Method]

(Step 1-a)

Figure 3:
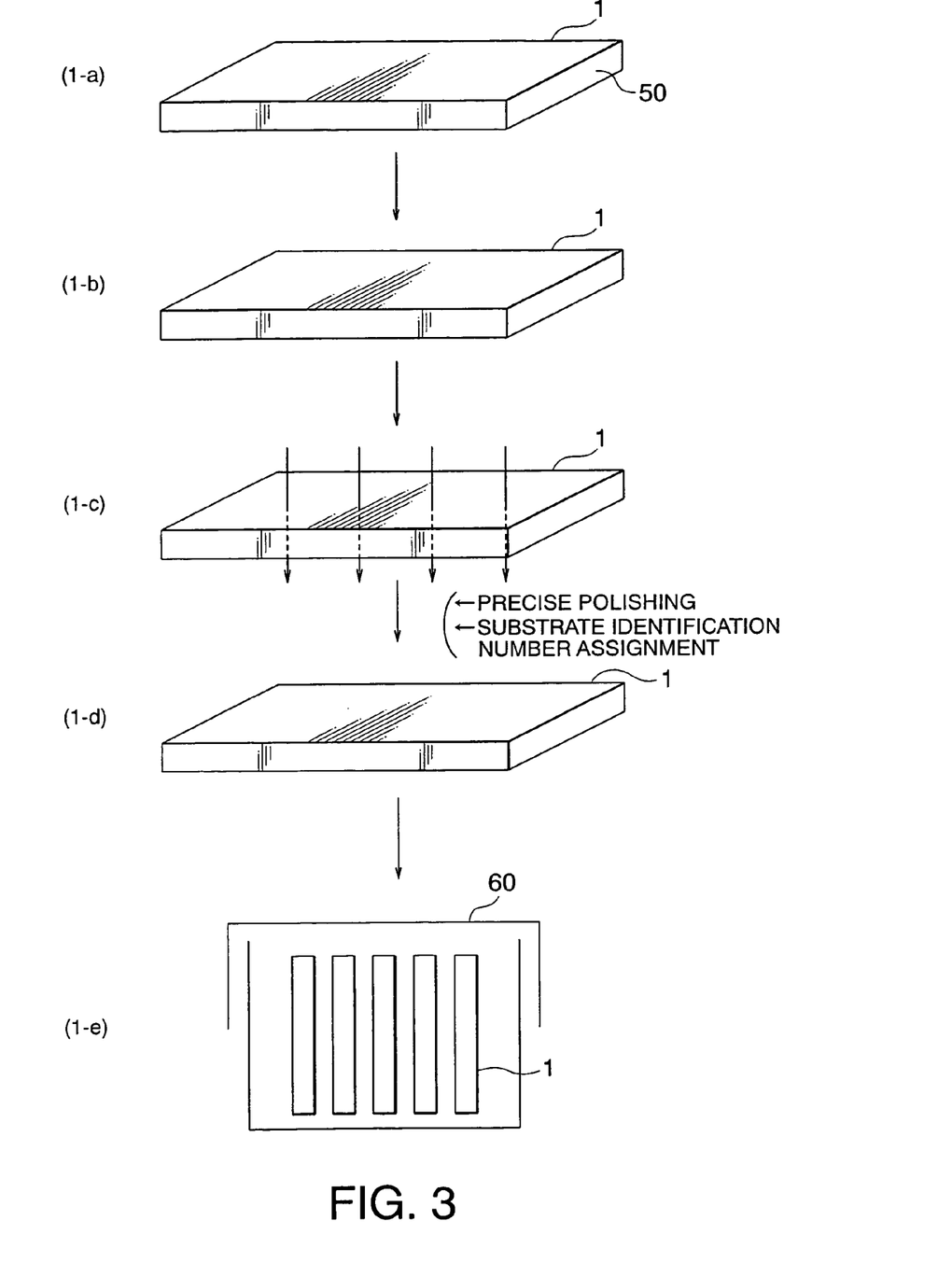
FIG. 3 is an explanatory diagram showing a mask blank transparent substrate manufacturing method.

At first, a synthetic quartz glass ingot is prepared and then is cut into a predetermined size (e.g. 152 mm×152 mm×6.5 mm) to thereby produce a synthetic quartz glass plate 50. As a manufacturing method for the synthetic quartz glass plate 50, use may be made of a known method as described, for example, in JP-A-H08-31723 or JP-A-2003-81654.

(Step 1-b)

Then, the synthetic quartz glass plate 50 is subjected to chamfering and the surfaces including both principal surfaces of the synthetic quartz glass plate 50 are polished to mirror surfaces that enable measurement of a transmittance for an exposure wavelength. Thus, the synthetic quartz glass substrate (the mask blank transparent substrate 1) is obtained.

(Step 1-c)

Then, light of a deuterium lamp (wavelength: 193 nm) is irradiated to a plurality of portions (e.g. nine portions) on one of the principal surfaces of the polished synthetic quartz glass substrate 1 to thereby measure the transmittance (transmittance variation) in the substrate plane. The measurement of the transmittance can be carried out by the use of, for example, a spectrophotometer (U-4100 manufactured by Hitachi, Ltd.) and the transmittance can be calculated from a difference between the quantity of input inspection light and the quantity of output inspection light.

Since in-plane variation of optical characteristics (transmittance) required for a mask blank for ArF excimer laser exposure is 6.0%±0.2%, transmittance variation in the substrate plane required for the glass substrate in consideration of transmittance variation of a thin film (specification of the mask blank glass substrate) can be set to 90%±2%.

In order to finish the surfaces of the synthetic quartz glass substrate 1 to a desired surface roughness, the surfaces including both principal surfaces may be precisely polished again.

Further, in order to enable correlation between the result of the measurement of transmittance in the substrate plane and the synthetic quartz glass substrate 1, a substrate identification number is assigned inside the glass substrate 1. For example, the identification number can be assigned by the use of a known technique as described, for example, in JP-A-2004-83377.

(Step 1-d)

Then, the synthetic quartz glass substrate 1 and the measurement result are correlated with each other. For example, in the case of directly assigning an identification number to a glass substrate 1, the substrate identification number assigned to the glass substrate and a file name storing the measurement result are correlated with each other. On the other hand, in the case of not directly assigning an identification number to a glass substrate, a later-described glass substrate container capable of storing a plurality of mask blank transparent substrates may be assigned substrate identification numbers corresponding to the respective glass substrates and these substrate identification numbers may be correlated with file names storing the measurement results.

(Step 1-e)

A plurality of thus obtained synthetic quartz glass substrates 1 are stored in a known glass substrate container 60 (e.g. one described in JP-A-2003-264225) and provided to the mask blank manufacturing department that manufactures mask blanks.

In this event, the in-plane transmittance variation data of the synthetic quartz glass substrates 1 are also provided to the mask blank manufacturing department along with the synthetic quartz glass substrates 1. These in-plane transmittance variation data may be provided to the server of the mask blank manufacturing department through the communication line as described before, may be read from the mask blank manufacturing department side by accessing the server of the materials processing department, or may be provided by the use of a facsimile or electronic mail system.

On the other hand, the in-plane transmittance variation data may be attached to the glass substrate container 60 storing the synthetic quartz glass substrates 1 so as to be provided to the mask blank manufacturing department. In this case, the transmittance variation data are recorded in a paper medium or a storage medium (flexible disk, CD, etc.) which is then attached to the glass substrate container 60.

Although not shown in the foregoing description, a cleaning process can be suitably provided.

In the mask blank transparent substrate manufacturing method, it is possible to assure transmittance variation in the substrate plane even in the short wavelength region of 140 nm to 200 nm of the exposure light source such as the ArF excimer laser or the F2 excimer laser. Therefore, it is possible to prevent the deviation from the specification of the mask blank transparent substrate.

[Mask Blank Transparent Substrate Providing Method]

Now, description will be made about the mask blank transparent substrate providing method that provides mask blank transparent substrates manufactured by the materials processing department to the mask blank manufacturing department along with data of transmittance variation in the transparent substrate plane with respect to an exposure wavelength.

After the measurement of transmittance by the transmittance measurement device 100, mask blank transparent substrates manufactured by the materials processing department are put into a glass substrate container and provided to the mask blank manufacturing department. The glass substrates 1 stored in the glass substrate container 60 are assigned substrate identification numbers so that the individual glass substrates 1 can be identified. These identification numbers are correlated with data of transmittance variation in the glass substrate planes stored in the foregoing server.

The measured data of each glass substrate is table-format data including measurement point numbers, measurement point coordinates (x-coordinates and y-coordinates), and transmittances and is stored with a file name (e.g. ArFQZ20040607-000001, ArFQZ20040607-000002, . . . ) assigned thereto. The measured data is not limited to the table format but may be in a format that visually shows a transmittance distribution in the substrate plane. Further, the file name is not necessarily assigned per glass substrate, but may be assigned per glass substrate container or per a plurality of glass substrates provided to the mask blank manufacturing department.

The files storing the measured data are, for example, transmitted to the mask blank manufacturing department through the communication line and stored in the server of the mask blank manufacturing department. In the mask blank manufacturing department, it is possible to specify the data of transmittance variation in the substrate plane on the basis of the identification number of the glass substrate stored in the glass substrate container to thereby confirm the transmittance variation in the substrate plane of the identified glass substrate.

The data on transmittance variation in the glass substrate plane may be used simply for the confirmation, may be used as information for selecting a kind of thin film to be formed on the glass substrate, may be used as information for selecting an exposure wavelength to be used for a mask blank, or may be used as information for assuring the optical characteristics of the glass substrate with respect to the mask manufacturing department. However, the use of the transmittance variation data is not limited to the foregoing using manners.

[Mask Blank Manufacturing Method]

(Step 2-a)

Figure 4:
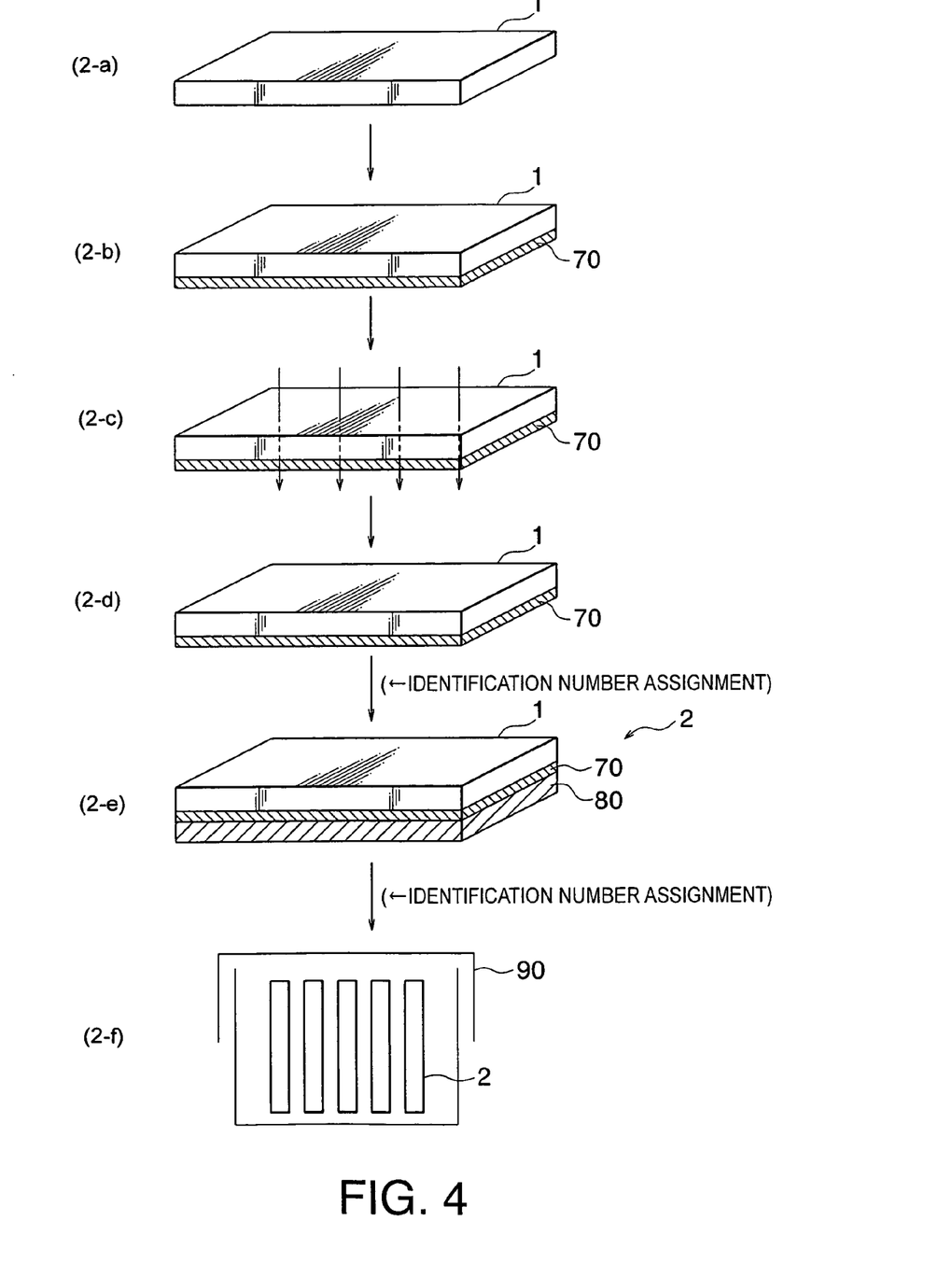
FIG. 4 is an explanatory diagram showing a mask blank manufacturing method.

Preparation is made of the mask blank glass substrate (the mask blank transparent substrate) 1 provided from the materials processing department, for which the foregoing optical characteristics (transmittance variation in the substrate plane is 90%±2%) are assured. This glass substrate 1 is assigned on the inside thereof the substrate identification number correlated with the data of transmittance variation in the substrate plane.

The selection of the glass substrate 1 is performed at the selection section 25 by searching for one having a transmittance suitable for a kind of thin film to be formed on a glass substrate.

(Step 2-b)

Then, a thin film (halftone film) 70 to be a mask pattern is formed on the principal surface of the glass substrate 1 by sputtering. In order to suppress the in-plane transmittance variation and the in-plane phase difference variation, the formation of the halftone film 70 is preferably carried out by the use of a sputtering apparatus having the following structure.

Figure 5:
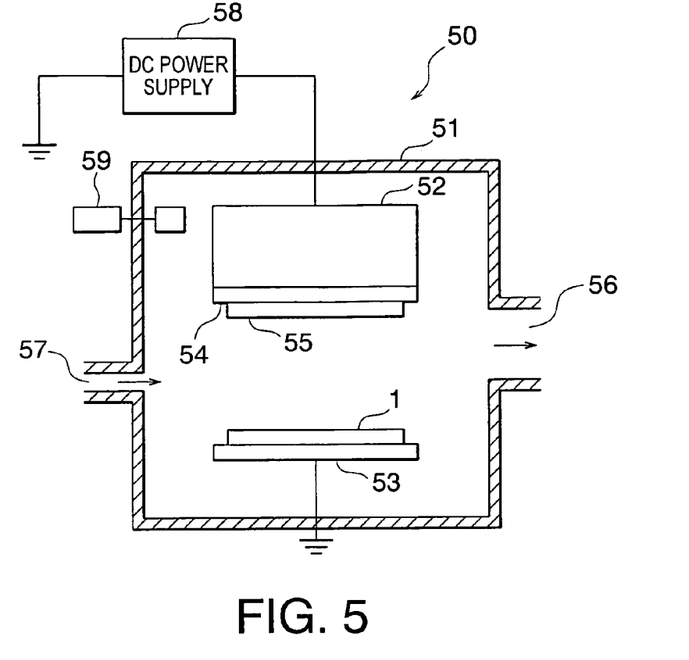
FIG. 5 is a schematic diagram of a sputtering apparatus.

As shown in FIG. 5, this sputtering apparatus 50 comprises a vacuum chamber 51 in which a magnetron cathode 52 and a substrate holder 53 are disposed. A sputtering target 55 bonded to a backing plate 54 is attached to the magnetron cathode 52. The backing plate 54 is directly or indirectly cooled by a water-cooling mechanism. The magnetron cathode 52, the backing plate 54, and the sputtering target 55 are electrically connected together. Further, a transparent substrate 1 is set on the substrate holder 53.

Figure 6:
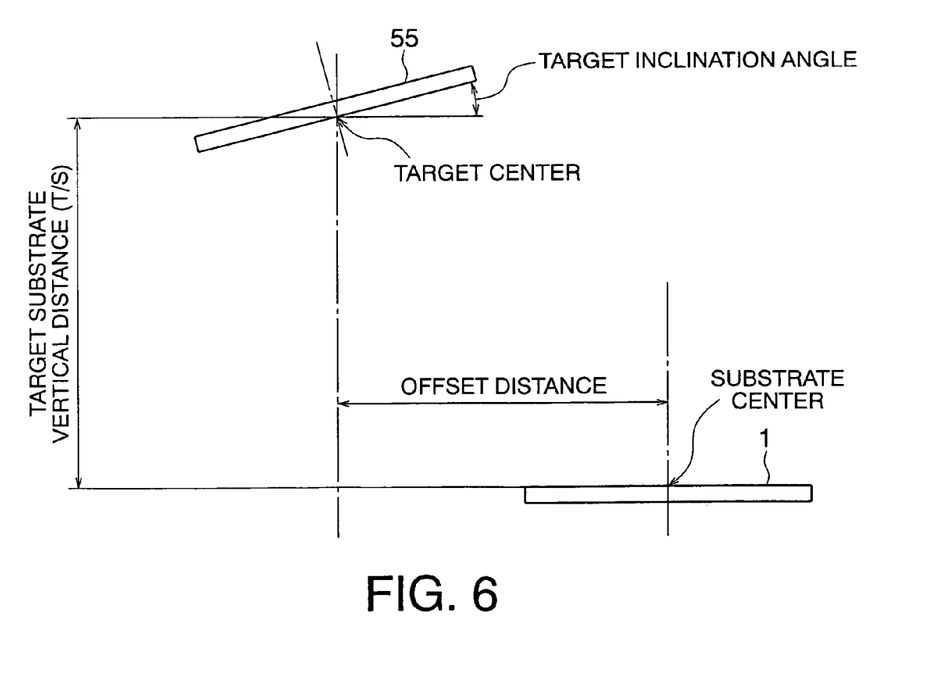
FIG. 6 is an enlarged view of the main part of the sputtering apparatus.

As shown in FIG. 6, the sputtering target 55 and the transparent substrate 1 are disposed so that opposed surfaces thereof form a predetermined angle therebetween. In this case, an offset distance (e.g. 340 mm) between the sputtering target 55 and the transparent substrate 1, a target-substrate vertical distance (e.g. 380 mm), and a target inclination angle (e.g. 15°) are appropriately determined.

The vacuum chamber 51 is evacuated by a vacuum pump through an exhaust port 56. After an atmosphere in the vacuum chamber 51 has reached a vacuum degree that does not affect the characteristics of a film to be formed, a mixed gas containing nitrogen is introduced from a gas inlet 57 and a negative voltage is applied to the magnetron cathode 52 by the use of a DC power supply 58. In this manner, sputtering is carried out. The DC power supply 58 has an arc detection function and thus is capable of monitoring a discharge state during the sputtering. The pressure inside the vacuum chamber 51 is measured by a pressure gauge 59. The transmittance of the halftone film to be formed on the transparent substrate is adjusted by kinds and a mixture ratio of gases introduced from the gas inlet 57. When the mixed gas includes argon and nitrogen, the transmittance increases by raising the ratio of nitrogen. When a required transmittance cannot be obtained only by adjusting the ratio of nitrogen, it is possible to further increase the transmittance by adding oxygen to the mixed gas containing nitrogen. The phase angle of the halftone film is adjusted by a sputtering time and it is possible to adjust the phase angle in the exposure wavelength to about 180°.

(Step 2-c)

Then, the optical characteristics of the halftone film 70 are measured by the use of the optical characteristic measurement device 200. Specifically, light of a deuterium lamp (wavelength: 193 nm) is irradiated to nine portions on the surface of the halftone film 70 to thereby measure the in-plane transmittance (transmittance variation) and the in-plane phase difference (phase difference variation). The measurement of the transmittance can be carried out by the use of a spectrophotometer (U-4100 manufactured by Hitachi, Ltd.) and the measurement of the phase difference can be carried out by the use of a phase difference measurement device (MPM-193 manufactured by Lasertech, Inc.).

Since the in-plane variation of optical characteristics (transmittance and phase difference) required for a mask blank for ArF excimer laser exposure is 6.0%±0.2% for the transmittance variation and 180°±3° for the phase difference variation, confirmation is performed to check whether these specifications are satisfied.

(Step 2-d)

Then, the substrate 1 with the halftone film 70 and the measurement result are correlated with each other. For example, by the use of the substrate identification number assigned to the glass substrate 1, correlation is performed with a file name storing the measurement result. By the use of the substrate identification number assigned to the glass substrate, it is possible to perform correlation with the measurement result of the transmittance variation in the glass substrate plane. Alternatively, a mask blank identification number is directly or indirectly assigned to the glass substrate 1 with the halftone film 70 and the mask blank identification number and the measurement result of the transmittance variation and phase difference variation of the halftone film 70 are correlated with each other, and further the substrate identification number and the mask blank identification number are correlated with each other. In this manner, correlation with the measurement result of the transmittance variation in the glass substrate plane can be carried out.

With respect to the transmittance variation in the glass substrate plane and the transmittance variation and phase difference variation of the halftone film, it is preferable that coordinate systems of measurement points coincide with each other on the basis of notch marks formed at a corner of the glass substrate.

(Step 2-e)

Then, after forming a resist film 80 on the surface of the halftone film 70, a heat treatment is performed to thereby obtain a mask blank 2 (halftone type phase shift mask blank).

(Step 2-f

A plurality of thus obtained mask blanks 2 are stored in a known mask blank container 90 (e.g. one described in JP-B-H01-39653) and provided to the mask manufacturing department that manufactures masks.

In this event, the data of transmittance variation and phase difference variation in the planes of the mask blanks are also provided to the mask manufacturing department along with the mask blanks. Further, the data of transmittance variation in the glass substrate planes are also provided to the mask manufacturing department. These data may be provided to the server of the mask manufacturing department through the communication line as described before, may be read from the mask manufacturing department side by accessing the server of the mask blank manufacturing department, or may be provided by the use of a facsimile or electronic mail system.

On the other hand, those data may be attached to the mask blank container 90 storing the mask blanks so as to be provided to the mask manufacturing department. In this case, the data are recorded in a paper medium or a storage medium (flexible disk, CD, etc.) which is then attached to the mask blank container 90.

In order to correlate between each of the mask blanks stored in the mask blank container and the measured data, after forming the thin film to be a mask pattern on the glass substrate, laser light may be irradiated onto the halftone film, the shield film, or the resist film of each mask blank to assign a mask blank identification number that can individually specify the mask blank.

In the mask blank manufacturing method, it is possible to assure transmittance variation in the substrate plane even in the short wavelength region of 140 nm to 200 nm of the exposure light source such as the ArF excimer laser or the F2 excimer laser. Therefore, it is possible to prevent the deviation from the specification of the mask blank.

[Mask Blank Providing Method]

Now, description will be made about the mask blank providing method that provides mask blanks manufactured by the mask blank manufacturing department to the mask manufacturing department along with data of transmittance variation and so on in the mask blank plane with respect to the exposure wavelength.

Mask blanks manufactured by the mask blank manufacturing department are put into a mask blank container and provided to the mask manufacturing department. The mask blanks stored in the mask blank container are assigned mask blank identification numbers so that the individual mask blanks can be identified. These identification numbers are correlated with measured data of transmittance variation and phase difference variation in the mask blank planes stored in the foregoing server.

The measured data of each mask blank is table-format data including measurement point numbers, measurement point coordinates (x-coordinates and y-coordinates), transmittances, and phase differences and is stored with a file name (e.g. ArFHT20040607-100001, ArFHT20040607-100002, . . . ) assigned thereto and with correlation with the data of transmittance variation in the glass substrate plane. The measured data is not limited to the table format but may be in a format that visually shows transmittance variation and phase difference variation in the mask blank plane. Further, the file name is not necessarily assigned per mask blank, but may be assigned per mask blank container or per a plurality of mask blanks provided to the mask manufacturing department.

The files storing the measured data are, for example, transmitted to the mask manufacturing department through the communication line and stored in the server of the mask manufacturing department. In the mask manufacturing department, it is possible to specify the data of transmittance variation in the thin film plane and the data of phase difference variation in the thin film plane on the basis of the identification number of the mask blank stored in the mask blank container to thereby confirm the transmittance variation and/or the phase difference variation in the thin film plane of the identified mask blank.

The data of transmittance variation in the glass substrate plane and the data of transmittance variation and/or phase difference variation in the thin film plane of the mask blank may be used simply for the confirmation, may be used as information for determining a position for mask pattern formation when forming a mask pattern on the glass substrate by the use of the mask manufacturing system 301, may be used as information for correcting data of a mask pattern to be formed, or may be used as information for assuring the optical characteristics of a mask with respect to the device manufacturing department that manufactures semiconductor devices. However, the use of the data of transmittance variation in the glass substrate plane and the data of transmittance variation and/or phase difference variation in the thin film plane of the mask blank is not limited to the foregoing using manners.

The foregoing mask blank represents a mask blank in which a thin film to be a mask pattern is formed on a mask blank glass substrate, such as a halftone type shift mask blank in which a halftone film is formed on a mask blank glass substrate, a halftone type phase shift mask blank in which a halftone film and a shield film are formed on a mask blank glass substrate, a photomask blank in which a shield film is formed on a mask blank glass substrate, or a substrate-etching type phase shift mask blank. Further, it may also be a mask blank with a resist film in which the resist film is formed on the foregoing thin film.

The mask blank of this invention is particularly effective as a mask blank for which the wavelength region of an exposure light source is 140 nm to 200 nm, such as a mask blank for ArF excimer laser exposure or a mask blank for F2 excimer laser exposure.

A material of the transparent substrate is not limited to the synthetic quartz glass but may be a fluorine-doped synthetic quartz glass, a calcium fluoride, or the like.

Figure 7:
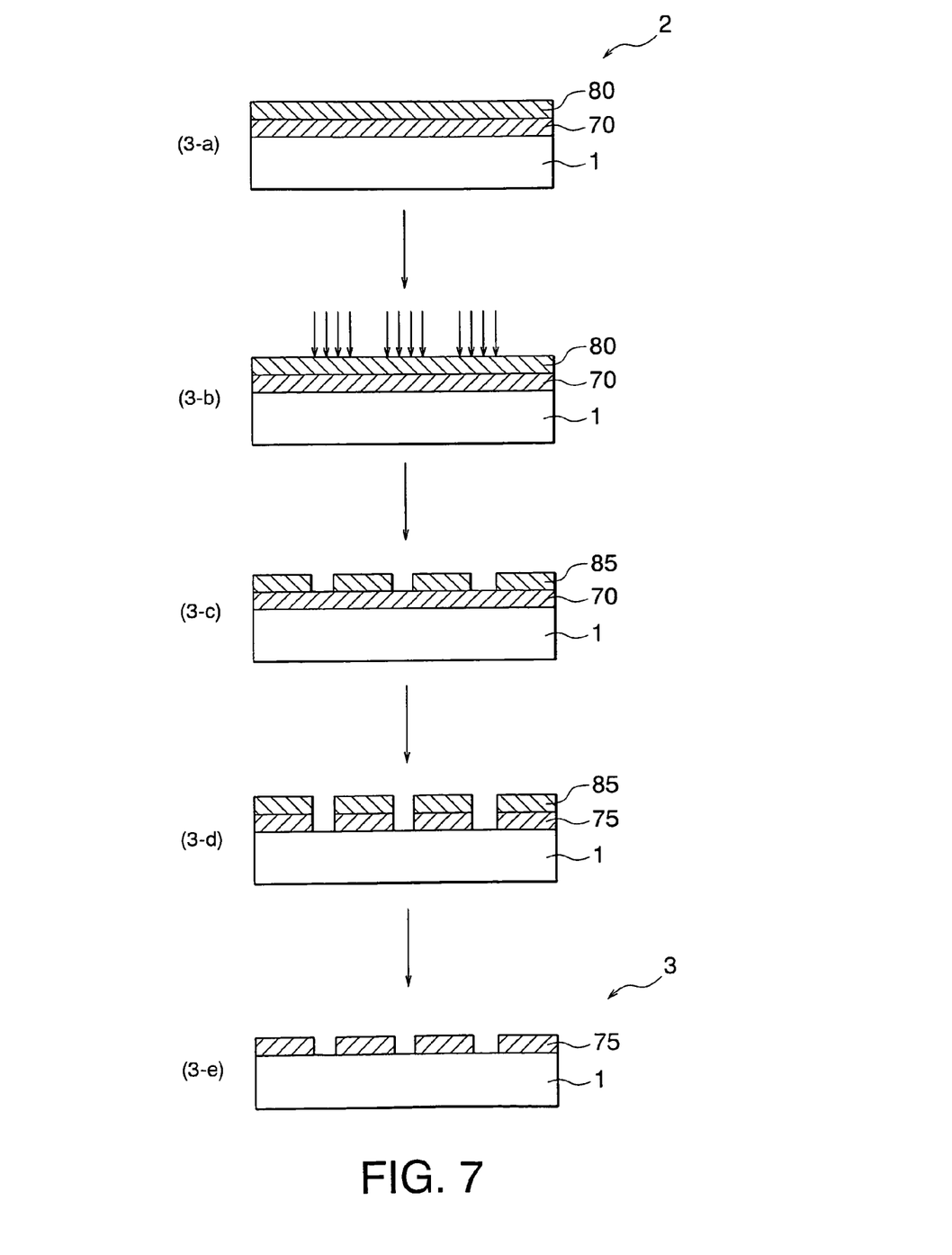
FIG. 7 is an explanatory diagram showing a mask manufacturing method.

Referring now to FIG. 7, description will be made about a mask manufacturing method according to this invention.

[Mask Manufacturing Method]

(Step 3-a)

Preparation is made of the mask blank where the halftone film 70 and the resist film 80 for which the optical characteristics are assured like the transmittance variation in the thin film plane is 6.0%±0.2% and the phase difference variation in the thin film plane is 180°±3°, are formed on the mask blank glass substrate 1 for which the foregoing optical characteristics (transmittance variation in the substrate plane is 90%±2%) are assured.

(Step 3-b and Step 3-c)

Then, a predetermined pattern is written on the resist film 80 in the mask blank 2 and then is subjected to development so that a resist pattern 85 is formed. In this event, the writing and development can be performed after determining the position and arrangement of a mask pattern to be formed on the glass substrate on the basis of the data of transmittance variation in the glass substrate plane and the data of transmittance variation and phase difference variation in the thin film plane of the mask blank. Alternatively, the writing and development can be performed after correcting mask pattern data on the basis of those data upon designing a mask pattern so that the shape of a transfer pattern on a transfer target satisfies a required pattern shape.

(Step 3-d)

Then, using the foregoing resist pattern 85 as a mask, dry etching is applied to the halftone film 70 to thereby form a halftone film pattern 75.

(Step 3-e)

Finally, the resist pattern 85 is removed to thereby obtain a mask 3 formed with halftone film pattern 75 on the glass substrate 1.

The obtained mask 3 is attached with a pellicle and put into a known mask container 95 so as to be provided to the device manufacturing department that manufactures semiconductor devices.

Example and Comparative Example

Hereinbelow, an example and a comparative example will be shown to describe in detail the mask blank transparent substrate manufacturing method, the mask blank transparent substrate providing method, the mask blank manufacturing method, the mask blank providing method, and the mask manufacturing method according to this invention.

Example 1

A synthetic quartz glass ingot produced by burning a mixture of silicon tetrachloride, hydrogen, and oxygen was cut into a size of about 152 mm×152 mm×6.5 mm so as to produce 100 synthetic quartz glass plates.

Then, chamfering was subjected to each synthetic quartz glass plate and the surface including both principal surfaces of each synthetic quartz glass plate was polished so that the surface roughness Ra (arithmetic average surface roughness) became 0.5 nm or less to enable measurement of a transmittance with respect to an exposure wavelength.

Further, in order to enable correlation between measured data of transmittance in the substrate plane and each of synthetic quartz glass substrates, which will be described later, a substrate identification number was assigned inside each glass substrate by the use of a known technique.

Then, light of a deuterium lamp (wavelength: 193 nm) was irradiated to nine portions on one of the principal surfaces of each polished synthetic quartz glass substrate to thereby measure the transmittance (transmittance variation) in the substrate plane. The measurement of the transmittance was carried out by the use of a spectrophotometer (U-4100 manufactured by Hitachi, Ltd.) and the transmittance was calculated from a difference between the quantity of input inspection light and the quantity of output inspection light.

The measured transmittance data of the 100 synthetic quartz glass substrates were stored in information storage means such as a personal computer in a manner correlated with the foregoing glass substrate identification numbers.

The transmittance variation in the substrate plane of each of the 100 synthetic quartz glass substrates was 90%±2%. This satisfied the specification designated from the mask blank manufacturing department.

These obtained synthetic quartz glass substrates were put into known glass substrate containers each including five glass substrates.

The glass substrate containers including the synthetic quartz glass substrates were provided to the mask blank manufacturing department.

Files storing the measured data were provided to the server of the mask blank manufacturing department by the use of the communication line. In the server of the mask blank manufacturing department, the files transmitted from the materials processing department were stored.

By the use of the identification numbers of the glass substrates included in the glass substrate containers, the mask blank manufacturing department can confirm the data of transmittance variation in the substrate planes correlated with transmitted file names.

The mask blank manufacturing department makes selection or confirmation whether the glass substrate is suitable for a halftone type phase shift mask blank for the ArF excimer laser exposure on the basis of the data on transmittance variation in the glass substrate plane provided from the materials processing department.

Then, by the use of the foregoing sputtering apparatus, 100 halftone type phase shift mask blanks for the ArF excimer laser exposure were produced.

Specifically, by the use of a molybdenum (Mo) and silicon (Si) mixed target (Mo:Si=8:92 mol %), a nitrogenized molybdenum and silicon (MoSiN) halftone film (thickness: about 67 nm) was formed on the synthetic quartz glass substrate by reactive sputtering (DC sputtering) in an argon (Ar) and nitrogen ($N_2$) mixed gas atmosphere ($Ar:N_2=10\%:90\%$, pressure: 0.1 Pa). The composition of the halftone film was Mo:Si:N=7:45:48.

The in-plane transmittance variation and phase difference variation of the 100 halftone films produced by the foregoing process 2-c were measured and it was confirmed that the in-plane transmittance variation was 6.0%±0.2% and the in-plane phase difference variation was 180±3° with respect to all the 100 halftone films, thus satisfying the specification.

Then, laser light was irradiated to the halftone films to thereby assign mask blank identification numbers for individually identifying the substrates with the halftone films. By the use of these identification numbers, correlation was performed with the file names storing the foregoing measurement results. Simultaneously, by the use of the substrate identification numbers assigned to the glass substrates, correlation was also performed with the measurement results of transmittance variation in the glass substrate planes.

Then, after applying a resist film by the use of a rotary application apparatus, a heat treatment was performed to form the resist film having a thickness of 400 nm on the halftone film. Thus, a halftone type phase shift mask blank was obtained.

Measured data of transmittance and phase difference in the halftone film planes of the 100 mask blanks were stored in the server in a manner correlated with the foregoing mask blank identification numbers.

The transmittance variation and phase difference variation in the halftone film plane of each of the 100 mask blanks was 6.0%±0.2% and 180°±3°, respectively. This satisfied the specification designated from the mask manufacturing department.

These obtained halftone type phase shift mask blanks were put into known mask blank containers each including five mask blanks.

The mask blank containers including the mask blanks were provided to the mask manufacturing department.

Files storing the measured data were provided to the server of the mask manufacturing department by the use of the communication line. In the server of the mask manufacturing department, the files transmitted from the mask blank manufacturing department were stored.

By the use of the identification numbers of the mask blanks included in the mask blank containers, the mask manufacturing department can confirm the data of transmittance variation and phase difference variation in the halftone film planes correlated with transmitted file names.

By the use of the data of transmittance variation in the glass substrate planes and the data of transmittance variation and phase difference variation in the halftone film planes of the halftone type phase shift mask blanks provided from the mask blank manufacturing department, the mask manufacturing department determines arrangement of mask patterns to be formed on the glass substrates, respectively. Specifically, with respect to a region where a difference between the mean or center value of the transmittances or phase differences and the measured data is relatively large, the mask manufacturing department determines to change a direction of the substrate so that such a region is located outside a transfer pattern forming region where a pattern for transferring a mask pattern to a transfer target is formed.

Then, a predetermined pattern was written on the resist film and development was applied thereto to thereby form a resist pattern. Then, using the resist pattern as a mask, a halftone film pattern was formed by dry etching in a mixed gas atmosphere of an oxygen-based gas and a fluorine-based gas.

Finally, the resist film formed on the halftone film pattern was removed and a pellicle was attached thereto. In this manner, a mask was formed.

The obtained masks were each set in a stepper so as to transfer a mask pattern onto a semiconductor substrate formed with a resist film. Thus, a required pattern was formed on the semiconductor substrate to obtain a semiconductor device. The obtained semiconductor devices were free from pattern defect and thus excellent.

Comparative Example

The surface of each of synthetic quartz glass plates whose transmittance before precise polishing was assured to exhibit a certain predetermined value or more was precisely polished and synthetic quartz glass substrates each having a size of 152.4 mm×152.4 mm×6.35 mm were prepared.

Then, like in Example 1, 100 halftone type phase shift mask blanks for the ArF excimer laser exposure were produced by the use of the foregoing sputtering apparatus.

The in-plane transmittance variation ad phase difference variation of the 100 halftone films produced by the foregoing step 2-c were measured and it was confirmed that 94 in 100 halftone films satisfied the specification of the transmittance variation being 6.0%±0.2% and the phase difference variation being 180°±3° and therefore 6 halftone films did not satisfy the specification.

The six halftone films not satisfying the specification were peeled off from the synthetic quartz glass substrates and then these synthetic quartz glass substrates were polished again. Upon measurement of transmittance variation in the substrate plane of each of those synthetic quartz glass substrates, it was confirmed that the transmittance was varied within a range of 90%±10%.

By the use of the halftone type phase shift mask blanks of this Comparative Example, halftone type phase shift masks were produced like in the foregoing Example 1. No pattern defect was found in a mask pattern in the form of the halftone film formed in each of the obtained halftone type phase shift masks. Then, this halftone type phase shift mask was set in a stepper so as to transfer a mask pattern onto a semiconductor substrate formed with a resist film. Thus, a required pattern was formed on the semiconductor substrate to obtain a semiconductor device. In each of the obtained semiconductor devices, a pattern defect was found which were considered to be caused by the transmittance variation of the glass substrate.

As described above, when the halftone type phase shift mask blanks for the ArF excimer laser exposure were produced by the use of the synthetic quartz glass substrates whose transmittance variation in the substrate planes with respect to the exposure wavelength was not assured, those not satisfying the specification were generated at a certain rate and the pattern defect occurred in the semiconductor devices. However, when use was made of the synthetic quartz glass substrates whose transmittance variation in the substrate planes was assured like in Example 1, all the produced mask blanks satisfied the specification and the obtained semiconductor devices were free from pattern defect and thus excellent.

In the foregoing Example 1, only the halftone type phase shift mask blank for the ArF excimer laser exposure was given as the example. However, this invention is not limited thereto. Similar effects are achieved in the case of, for example, a halftone type phase shift mask blank for the F2 excimer laser exposure, a binary photomask in which only a shield film is formed on a mask blank transparent substrate (a resist film may also be formed), or a photomask blank for a chromeless mask.

This invention is applied to a mask blank transparent substrate providing method, a mask blank providing method, a mask blank transparent substrate manufacturing method, a mask blank manufacturing method, and a mask manufacturing method. By assuring the optical characteristics of a mask blank transparent substrate and a mask blank, it is possible to prevent deviation from a specification relating to the optical characteristics of the mask blank and occurrence of a pattern defect of a transfer target. This invention is particularly suitable when an ArF excimer laser or a F2 excimer laser is used as an exposure light source.

While this invention has thus far been disclosed in conjunction with a few embodiments and examples thereof, it will be readily possible for those skilled in the art to put this invention into practice in various other manners.

What is claimed is:

1. A mask blank providing system comprising:
    substrate information storage means for storing first optical characteristic information of a mask blank transparent substrate with respect to an exposure wavelength in a manner correlated with the mask blank transparent substrate;
    mask blank information storage means for storing second optical characteristic information of a mask blank with respect to the exposure wavelength in a manner correlated with the mask blank, the second optical characteristic information being different from the first optical characteristic information;
    substrate information providing means for providing, to the mask blank manufacturing department and/or said mask manufacturing department, the first optical characteristic information of the mask blank transparent substrate stored in the substrate information storage means; and
    mask blank information providing means for providing, to the mask manufacturing department, the second optical characteristic information of the mask blank stored in the mask blank information storage means,
    wherein the first optical characteristic information of the mask blank transparent substrate includes variation in a substrate plane with respect to optical characteristic.

2. A mask blank providing system according to claim 1, further comprising: a server of a materials processing department that manufactures the mask blank transparent substrate, a server of the mask blank manufacturing department that manufactures the mask blank by forming a thin film to be a mask pattern on the mask blank transparent substrate, a server of the mask manufacturing department that manufactures a mask by patterning the thin film of the mask blank, and a communication line connecting the servers to allow communications therebetween,
    wherein the server of the materials processing department comprises the substrate information storage means,
    the server of the mask blank manufacturing department comprises the substrate information storage means and the mask blank information storage means, and
    the server of the mask manufacturing department comprises the substrate information storage means and the mask blank information storage means.

3. A mask blank providing system according to claim 1, further comprising:
    a transmit/receive section of a materials processing department that manufactures the mask blank transparent substrate, a transmit/receive section of the mask blank manufacturing department that manufactures the mask blank by forming a thin film to be a mask pattern on said mask blank transparent substrate, a transmit/receive section of the mask manufacturing department that manufactures a mask by patterning the thin film of said mask blank, and servers capable of communicating with the transmit/receive sections through a communication line,
    wherein the sewers include the substrate information storage means and the mask blank information storage means.

4. A mask blank providing system according to claim 1, further comprising:
    thin film selection means for selecting a thin film to be formed on the mask blank transparent substrate on the basis of the first optical characteristic information of the mask blank transparent substrate.

5. A mask blank providing system according to claim 1, wherein:
    the first optical characteristic information of the mask blank transparent substrate includes transmittance variation in the substrate plane with respect to the exposure wavelength.

6. A mask blank providing system according to claim 1, wherein:
    the second optical characteristic information of the mask blank includes transmittance variation and/or phase difference variation in the thin film plane with respect to the exposure wavelength.

7. A mask blank providing method, wherein:
    a mask blank manufacturing department manufactures a mask blank by forming a thin film to be a mask pattern on a mask blank transparent substrate and, when providing the mask blank to a mask manufacturing department, the mask blank manufacturing department provides, to the mask manufacturing department, first optical characteristic information of the mask blank transparent substrate with respect to an exposure wavelength and second optical characteristic information of the mask blank with respect to the exposure wavelength,
    wherein the first optical characteristic information of the mask blank transparent substrate includes variation in a substrate plane with respect to optical characteristic.

8. A mask blank providing method according to claim 7, wherein:
    the first optical characteristic information of the mask blank transparent substrate is provided to the mask blank manufacturing department from a materials processing department that manufactures the mask blank transparent substrate.

9. A mask blank providing method according to claim 7, wherein:
    the first optical characteristic information of the mask blank transparent substrate includes transmittance variation in the substrate plane with respect to the exposure wavelength.

10. A mask blank providing method according to claim 7, wherein:
    the second optical characteristic information of the mask blank includes transmittance variation and/or phase difference variation in the thin film plane with respect to the exposure wavelength.

11. A mask blank providing system according to claim 1, wherein:
    the exposure wavelength falls within a range of 140 nm to 200 nm.

12. A mask blank providing method according to claim 7, wherein:
    the exposure wavelength falls within a range of 140 nm to 200 nm.

* * * * *